United States Patent [19]
Cohen et al.

[11] Patent Number: 5,641,703
[45] Date of Patent: Jun. 24, 1997

[54] VOLTAGE PROGRAMMABLE LINKS FOR INTEGRATED CIRCUITS

[75] Inventors: Simon S. Cohen, Burlington; Jack I. Raffel, Lexington; Peter W. Wyatt, Lincoln, all of Mass.

[73] Assignee: Massachusetts Institute of Technology, Cambridge, Mass.

[21] Appl. No.: 430,303

[22] Filed: Apr. 28, 1995

Related U.S. Application Data

[63] Continuation of Ser. No. 918,586, Jul. 22, 1992, abandoned, which is a continuation-in-part of Ser. No. 860,678, Mar. 30, 1992, and a continuation-in-part of Ser. No. 735,427, Jul. 25, 1991, Pat. No. 5,258,643.

[51] Int. Cl.[6] .................................................. H01L 21/82
[52] U.S. Cl. ............................................. 438/467; 438/600
[58] Field of Search ........................... 437/47, 48, 52, 437/60, 172, 192, 200, 228, 235, 238, 241, 922; 257/530

[56] References Cited

U.S. PATENT DOCUMENTS

| | | | |
|---|---|---|---|
| 4,424,578 | 1/1984 | Miyamoto | 365/104 |
| 4,451,326 | 5/1984 | Gwozdz | 437/195 |
| 4,458,297 | 7/1984 | Stopper et al. | 361/403 |
| 4,507,852 | 4/1985 | Karulkar | 437/195 |
| 4,531,144 | 7/1985 | Holmberg | 357/71 |
| 4,543,594 | 9/1985 | Mohsen et al. | 357/51 |
| 4,585,490 | 4/1986 | Raffel et al. | 148/1.5 |
| 4,617,723 | 10/1986 | Mukai | 29/576 B |
| 4,638,400 | 1/1987 | Brown et al. | 437/195 |
| 4,680,854 | 7/1987 | Ho et al. | 29/576 B |
| 4,748,490 | 5/1988 | Hollingsworth | 357/51 |
| 4,758,745 | 7/1988 | El Gamal et al. | 307/465 |
| 4,810,673 | 3/1989 | Freeman | 437/239 |
| 4,823,181 | 4/1989 | Mohsen et al. | 357/51 |
| 4,835,118 | 5/1989 | Jones, Jr. et al. | 437/173 |
| 4,843,034 | 6/1989 | Herndon et al. | 437/189 |
| 4,847,732 | 7/1989 | Stopper et al. | 361/395 |
| 4,876,220 | 10/1989 | Mohsen et al. | 437/170 |
| 4,881,114 | 11/1989 | Mohsen et al. | 357/54 |
| 4,899,205 | 2/1990 | Hamdy et al. | 357/51 |
| 4,910,417 | 3/1990 | El Gamal et al. | 307/465 |
| 4,943,538 | 7/1990 | Mohsen et al. | 437/52 |
| 4,980,752 | 12/1990 | Jones, Jr. | 357/71 |
| 5,057,447 | 10/1991 | Paterson | 437/195 |
| 5,057,451 | 10/1991 | McCollum | 437/922 |
| 5,070,384 | 12/1991 | McCollum et al. | 357/51 |
| 5,087,578 | 2/1992 | Endo et al. | 437/195 |
| 5,087,589 | 2/1992 | Chapman et al. | 437/195 |
| 5,166,556 | 11/1992 | Hsu et al. | 257/530 |
| 5,171,715 | 12/1992 | Husher et al. | 437/195 |
| 5,272,101 | 12/1993 | Forouhi et al. | 437/50 |

FOREIGN PATENT DOCUMENTS

| | | |
|---|---|---|
| 0416903 | 4/1991 | European Pat. Off. . |
| 0067043 | 4/1983 | Japan . |
| 0066147 | 4/1984 | Japan . |
| 245229 | 9/1992 | Japan . |

OTHER PUBLICATIONS

Norman G. Einspruch et al., "VLSI Electronics Microstructure Science," vol. 15, VLSI Metallization, Academic Press, Inc. 1987, pp. 274–305.

(List continued on next page.)

*Primary Examiner*—Tom Thomas
*Attorney, Agent, or Firm*—Hamilton, Brook, Smith & Reynolds, P.C.

[57] ABSTRACT

Methods and systems are discussed for fabricating electrically programmable link structures by fabricating a first metal conductor of a refractory conductive material, composite, or an aluminum alloy which has been modified with a refractory material, then fabricating an insulating link material over the first conductor, and subsequently, depositing a second conductor over the link material. In use, an electrical path can be formed between the first and second conductors by applying a voltage between such conductors across at least one selected region of the insulator, such that the insulating link material is transformed in the region and rendered conductive to form an electrical signal path.

31 Claims, 5 Drawing Sheets

OTHER PUBLICATIONS

Simon S. Cohen et al., "VLSI Electronics Microstructure Science," vol. 13, Metal–Semiconductor Contacts and Devices, Academic Press, Inc., 1986, pp. 254–261.

Y. Pauleau, "Interconnect Materials for VLSI Circuits," *Solid State Technology*, vol. 30, No. 4, Apr. 1987, pp. 155–162.

Mansfeld et al., Development of "Stainless Aluminum", Electrochem. Soc. vol. 138, No. 12 (Dec. 1981).

Chiang et al., Oxide–Nitride–Oxide Antifuse Reliability, (1990) IEEE, I.R.P. Symp. 186.

Herndon et al., Multilevel Interconnect Planarization by Voltage and Laser Programmable Links Using Ion Implantation, (1989), IEEE VLSI Conf.

Kikkawa et al., Comparison of Refractory Metal and Silicide Capping Effects on Aluminum Metallizations, VMIC Conf. 463 (1989).

Hamdy et al., Dielectric Based Antifuse For Logic and Memory ICs, 88 IEEE Int'l. Electronic Device Meeting 786 (1988).

Brown et al., Reduction of Hillock Growth on Aluminum Alloys, Proc. Fourth Int'l. IEEE VLSI Conf. 426 (1987).

El–Ayat et al., A CMOS Electrically Configurable Gate Array, vol. 24, No. 3, Solid–State Circuites, pp. 752–762 (1989).

Brian Cook et al., "Amorphous Silicon Antifuse Technology for Bipolar PROMS," Bipolar Circuits and Technology Meeting, IEEE, pp. 99–100 (1986).

Shen et al., A Highly Reliable Aluminum Metallization For Micron and Submicron VLSI Applications, (Jun. 9–10, 1986) V–MIC Conf. 191.

Gardner et al., Layered and Homooeneous Films of Aluminum and Aluminum/Silicon with Titanium Zirconium, and Tungsten for Multilevel Intercon.

Stopper et al., Session XVIII: Modeling and Technology, 1985, IEEE Int'l Solid–State Circuits Conf. 268.

VOLTAGE PROGRAMMABLE LINKS FOR INTEGRATED CIRCUITS

REFERENCE TO RELATED APPLICATIONS

This application is a continuation of application Ser. No. 07/918,586 filed Jul. 22, 1992, now abandoned, which is a continuation-in-part of both U.S. patent application Ser. No. 07/860,678 filed Mar. 30, 1992 and U.S. patent application Ser. No. 07/735,427 filed Jul. 25, 1991, now U.S. Pat. No. 5,258,643.

The U.S. Government has rights in this invention pursuant to Contract No. F19628-90-C-0002 awarded by the Department of the Air Force.

BACKGROUND OF THE INVENTION

The technical field of this invention is solid state integrated circuit fabrication and, more particularly, methods for fabricating voltage programmable link structures.

Programmable conductive paths, particularly "links" between two or more distinct metallization layers, are increasingly employed in solid-state integrated circuit fabrication to produce a wide variety of programmable circuits including, for example, field programmable gate arrays ("FPGAs"), programmable read only memories ("PROMs"), and other programmable electronic devices.

Most typically, such devices are "programmed" by the application of an electrical voltage to trigger an "antifuse" link structure disposed between two metallization layers and thereby establish an electrical connection across a region of the device which had previously been an insulator.

While this approach should in theory permit an almost limitless variety of custom circuits, certain factors make programmable devices difficult to implement. To be useful, link structures must remain insulating at the normal operating voltage for solid state devices (e.g., nominally five volts), but must reliably "break down," or respond, to a programming voltage which is higher than the normal operating voltage, but not so high as to damage other structures on the circuit (e.g., not more than about fifteen volts).

If a link structure breaks down at a voltage below the programming voltage (or breakdown voltage) an unintended altered circuit will result, thereby disturbing the normal operation of the existing circuit. On the other hand, if the programmable link is over-resistant to the programming voltage, either the conductive path will not be formed when desired, or greater voltages must be applied with the attendant risk of damage to nearby structures on the wafer.

One problem with the fabrication of reliable, voltage programmable, metal to metal, link structures is that aluminum-based metallization (aluminum is almost universally used throughout the integrated circuit industry) has a tendency to form rather marked surface irregularities in the form of "hillocks" and the like, during sintering and other device processing steps. The hillocks are typically on the order of one micrometer in diameter and height. These hillocks can pierce or otherwise damage overlying insulator layers unless such insulator layers are rather thick (e.g., greater than about 500 nanometers). For conventional, multi-level metallization, hillocks are less troublesome because the intermetallic insulators normally used are thick, but fabrication of a link structure with a low programming voltage requires the use of a thin insulator.

The thin insulator layer required for link structures makes link structures particularly sensitive to the occurrence of hillocks. If the insulator layer is too thin, hillocks may damage the insulator thereby lowering the breakdown voltage below normal operating voltages. However, if a thick insulator layer is employed to avoid inadvertent breakdowns, the resulting programming voltage may be so high as to damage other structures on the wafer. Since hillocks do not occur according to a uniform distribution it is extremely difficult to manufacture a reliable link structure with a low programming voltage using aluminum-based metallization.

One way to avoid the problem of hillocks is to use non-metallic conductors, such as polysilicon or doped silicon, instead of aluminum. This approach allows the fabrication of reliable voltage programmable links, but due to the higher resistance of these conductors, such links tend to have an after programming resistance of many hundreds of Ohms, in contrast to links formed with aluminum conductors which can have a resistance of as low as 1 Ohm after programming.

Moreover, silicon and polysilicon are not suitable in many applications to make long conductors because of their high resistivity. Thus, if silicon or polysilicon-based conductors are used in link structures, connections must be made to metal layers. These connections or "contacts" must be relatively large, which limits the density of the voltage-programmable device. Furthermore, the large area of the link-plus-contacts results in high parasitic capacitance.

Thus, there is a need for better methods of manufacturing reliable, voltage programmable, metal-to-metal, link structures.

SUMMARY OF THE INVENTION

Methods and systems are disclosed for fabricating electrically programmable link structures by fabricating a first conductor, which comprises a refractory conductive material, then fabricating an insulative link material over the refractory conductive material and, subsequently, depositing an upper conductive material over the link material. In use, an electrical path can be formed between the first and second conductive elements by applying a programming voltage between such elements across at least one selected region of the insulator, such that the insulative link material is transformed in the region and rendered conductive to form an electrical signal path.

The present invention provides reliable link structures that can be consistently programmed by the application of programming voltages of about 10 volts or less, with a current of about 10 microamps or less, over a time of about 1 millisecond or less. These programming parameters are a significant improvement over prior art techniques and substantially reduce the possibility of damage to adjacent device structures during programming.

In one embodiment the first conductive element is entirely composed of a refractory conductive material. In another embodiment the first conductive element is a composite of non-refractory conductive material that is capped with a sufficient thickness of refractory conductive material. This embodiment is particularly useful because aluminum, a non-refractory material, can be retained as the primary conductor, and the refractory conductive material merely caps the aluminum. The lower conductive element will typically range from about 300 to about 1,000 nanometers in thickness. Up to about 95 percent of the conductive line can be aluminum so long as it is capped with about 5 nanometers or more of refractory conductive material.

In one embodiment, the refractory conductive material used in the lower conductive element is a refractory metal, refractory metal alloy, refractory metal nitride, or refractory metal silicide. The refractory conductive material should have a low thermal coefficient of expansion, for example, below $10.0 \times 10^{-6}$/°C., preferably below $7.0 \times 10^{-6}$/°C. and most preferably under $5.0 \times 10^{-6}$/° C.

This low thermal expansion coefficient is especially useful when a bulk refractory material is used as the conductive element because the metallization layer can be more closely matched thermally to the underlying substrate and/or devices therein which will typically be silicon-based materials. The low thermal expansion coefficient also provides a closer match to the silicon-based decomposable link materials which can be deposited to form the programmable links of the present invention as described in more detail below.

Particularly useful refractory conductive materials include titanium, titanium alloys, molybdenum, and molybdenum alloys which typically have a thermal expansion coefficient of about $4.0 \times 10^{-6}$/°C. (a value that matches silicon's coefficient, nominally $3.0 \times 10^{-6}$/°C., quite well).

In contrast to titanium, non-refractory materials such as aluminum or aluminum alloys, should not be used alone to form the lower conductive element because of their high thermal expansion coefficients, often about $25.0 \times 10^{-6}$/°C. When aluminum is used alone as the lower conductive material, its thermal expansion during the various wafer processing and device fabrication steps that follow can cause microfractures in the link material, resulting in premature breakdowns, inadvertent breakdowns and a wide variation in the voltage needed to program individual link structures from one site to another on a wafer.

Moreover, aluminum has a tendency to form rather marked surface irregularities in the form of "hillocks" and the like, during sintering and other device processing steps. These hillocks can pierce or otherwise damage overlying insulator layers unless such insulator layers are rather thick (e.g. greater than 500 nanometers).

The use of refractory materials, such as titanium, molybdenum or their alloys and compounds, even as thin "cap" layers, is also preferred because of the relatively smooth surfaces that can be achieved with such metallization layers.

Because the refractory conductive materials disclosed herein substantially match the thermal expansion characteristics of the link materials, the likelihood of detrimental thermal stresses, microfractures, etc. is greatly reduced. In addition, the smooth surface topography of the refractory conductive materials in the present invention reduces the chance that projections from the metal layer can pierce or otherwise damage the adjacent link material, and thereby permits thinner insulators to be used. As a consequence, the link structures of the present invention can be programmed by application of a substantially uniform threshold voltage with little deviation from one link to another in use.

In one preferred embodiment of the invention, the lower refractory conductive material should maintain a smooth upper surface throughout processing, that is, a surface defined by the substantial absence of hillocks and other projections greater than about 10 nanometers above the nominal plane of the surface, and more preferably defined by the absence of hillocks and the like greater than about 5 nanometers in height.

It should be noted that some refractory conductive materials useful in the present invention can have a surface topography, as deposited, that is slightly coarse (e.g. with grains that may vary in height from one to another by about 1 to 5 nanometers) due to the vertical columnar structures that are typically present in molydenum and similar materials, as initially formed. Such surface irregularities do not appear to effect the performance of link structures.

In another preferred embodiment, the lower conductive element comprises "modified aluminum" which is aluminum that incorporates a refractory conductive material in a region near, at least, the surface of the aluminum. Modified aluminum is formed by "treating" aluminum with a refractory conductive material. This embodiment is useful because the modified aluminum can be produced by processes that differ only minimally from the standard integrated circuit manufacturing process.

In one embodiment, the modified aluminum is produced by first depositing a layer of aluminum according to standard processing techniques. The aluminum layer can then be patterned (e.g., by masking and etching or the like) to form conductive lines. Then a thin layer of refractory conductive material is deposited over the entire wafer substrate, or just those portions where links are desired. The wafer is then sintered, which causes an intermetallic compound to form near the adjacent surfaces of the aluminum and the refractory conductive material.

Following the aluminum-modifying step of sintering, the layer of refractory material is removed (e.g., by selective etching) from those portions of the wafer where it has not been incorporated into the metallization. This re-exposes the substrate in regions where no aluminum was present, but the surface of the aluminum remains as an intermetallic compound. This intermetallic compound effectively prevents the aluminum from forming hillocks during later processing steps. The resulting, modified aluminum has a very flat surface (e.g., surface irregularities with height of less than 50 nanometers over a span of greater than about 10 micrometers).

In another embodiment, the aluminum alloy is patterned as above, and then a refractory metal is deposited selectively only on the aluminum surfaces. The wafer is then sintered as above, with no selective etch step required.

In another embodiment, an aluminum layer can be deposited, and followed directly by the deposition of a refractory conductive material. The bimetallic layer can next be sintered and then patterned (or vice versa) to yield a similar surface-modified aluminum metallization. The sintering may take place either before or after deposition of insulating layers.

In some applications it may also be desirable to add another layer to the lower conductive element by depositing a very thin layer (e.g., less than about 50 nanometers) of aluminum, or another ductile metal or metal alloy, or silicon on top of the refractory material. This coating layer is too thin to cause hillocks or other potentially damaging surface phenomena, but it protects the refractory material during subsequent processing steps. If modified aluminum is used, the coating layer may be deposited either before or after sintering.

Once the lower conductive element has been formed, it is overlaid with a transformable link insulator at each programmable link site. The link material is preferably a silicon oxide insulator and can also include one or more other insulating layers to physically separate the oxide from the first and second conductive elements. Silicon nitrides are particularly useful as protective barrier layers in separating the oxide layer from aluminum based metallization.

The transformable insulator can be formed (e.g., by deposition) of silicon oxide, silicon nitride or combinations of these materials. In one preferred embodiment, a three part structure can be employed comprising a silicon nitride— silicon oxide—silicon nitride composite. In contrast to prior art sandwich structures, this composite link structure protects the oxide component from, rather than exposing it to, the conductive metal lines, thereby minimizing the chance of chemical reactions that could degrade the structure over time.

It is also preferable to deposit the various link insulator components by plasma-enhanced chemical vapor deposition (PECVD) rather than by thermal growth or thermal chemical vapor deposition (CVD). PECVD is a highly controllable process and, since it is performed at a relatively low temperature, permits the use of aluminum as a first layer conductor, rather than conductors with a higher melting point such as polysilicon. Also, thermally grown oxides tend to be very robust so that even very thin layers require high programming voltages. The use of PECVD oxide and nitride layers allows the use of a thicker insulator layer, thereby reducing parasitic capacitances, while still retaining a low programming voltage.

Moreover PECVD techniques permit control over the silicon content. In forming the link structures of the present invention, silicon-rich insulators have been found useful. In some applications, it may be preferable to deposit silicon-rich compositions with up to twice as much silicon as the normal ($SiO_2$ and $Si_3N_4$) stoichiometric formulae. For example, when silicon-rich compositions are desired, the oxide layers of the link compositions can be described by the formula: $SiO_x$, where x can range from about 1.5 to about 2.0, and the nitride layers can be described by the formula: $SiN_y$, where y can range from about 0.3 to about 1.3.

Apart from the regions where a transformable insulator is fabricated, a thick oxide insulator normally separates the lower and upper conductive layers. The thick insulator may be deposited either before or after the transformable insulator. In one approach, for example, the thick insulator is deposited over the entire surface and then etched away in regions where programmable links are desired. A transformable insulator is then deposited in those regions.

Once the transformable insulator is deposited, an upper conductive element can be deposited above the link material and the lower conductive element. This second metallization layer can be aluminum or any other low resistance conductive material.

In some applications, it can be preferable to construct the upper conductive layer as a mirror image of the lower conductive layer. Thus, the wafer again can be covered by a thin layer of refractory conductive material followed by a standard aluminum metallization layer. If modified aluminum is desired, sintering the wafer then forms an intermetallic compound of aluminum and the refractory material at the metallization surface which contacts the link insulator. Then the second metallization layer is patterned, leaving an upper conductive element over the link material.

In other embodiments, the composition of the upper metallization may be further modified by co-depositing aluminum and the refractory metal (either sequentially or together), and then sintering the structure to create a bimetallic compound with enough refractory components throughout to achieve a hillock-free boundary. In another embodiment, the upper metallization can be formed by sequentially depositing a refractory metal, aluminum and a second refractory layer, and then sintering. In yet another embodiment, a tri-layer composite upper metallization of sequential aluminum, refractory metal and aluminum layers can be deposited as the upper conductor, with the first aluminum deposition being very thin (e.g. about 10–30 nanometers) to isolate the insulator from possible damage during the refractory deposition.

In another embodiment, the upper conductive layer can include a thin bottom film of non-refractory metal, such as aluminum. The thin metal film can be deposited over the transformable insulator in order to protect it during subsequent processing steps. For example, in one embodiment, the thin metal film is deposited above the transformable insulator over the entire wafer surface. The metal film is then patterned (e.g., by resist masking) and removed except in the link regions. A thick insulator is subsequently deposited over the entire surface and then etched away to expose the link regions. The remaining thin metal film pads act as etch stops which protect the transformable insulator from damage during the steps of depositing and etching the thick insulator. The thin film also protects the transformable insulator during deposition of the rest of the upper conductive layer. Protecting the integrity of the transformable insulator results in voltage programmable links which exhibit a more uniform distribution of breakdown voltages.

When the structures of the present invention are formed, conductive links can be formed by the application of a predetermined voltage, typically greater than seven volts but less than 15 volts, preferably on the order of about 7.5 to about 12.5 volts, and most preferably on the order of about 8.5 to about 10.5 volts. The application of this voltage results in localized dielectric break down and formation of a conductive path.

The invention will be described below in connection with certain illustrated embodiments. However, it should be clear that various additions, subtractions and modifications can be made by those skilled in the art without departing from the spirit or the scope of the claims. For example, the term "aluminum" as used herein is intended to encompass not only pure aluminum but also various aluminum alloys, including AlSi, AlSiCu, AlCu, AlTi, AlCuCr and the like which are known and used routinely in the semiconductor industry.

Although the terms "first" and "second" metallization layers are used herein to distinguish between lower and upper metallization lines, it should be clear that the "first" metallization line need not be the first or lowest conductive path in the integrated circuit. Likewise, the "second" layer need not be the only other metallization layer. There may be other metallization layers that do not enter into the programmable link.

Moreover, the invention can be practiced to establish links between more than two conductive layers, the terms "first" and "second" being merely shorthand expressions for the bottom and top of the conductive path, respectively.

Likewise, the term "substrate" is used herein to describe various layers which may lie below the "first" metallization layer, including the bulk silicon of the wafer, active devices (e.g. sources, gates and/or drain regions), field oxide layers, gate oxide layers, and other structures as the case may be. Finally, it should be appreciated that the link structures and methods of the present invention need not be limited to silicon-based devices, but rather can also find applications in other semiconductor devices, such as gallium arsenide structures and the like.

BRIEF DESCRIPTION OF THE DRAWINGS

FIG. 2A is a schematic illustration of an initial processing step, FIG. 2B is a second processing step.

DETAILED DESCRIPTION

Figure 1A:
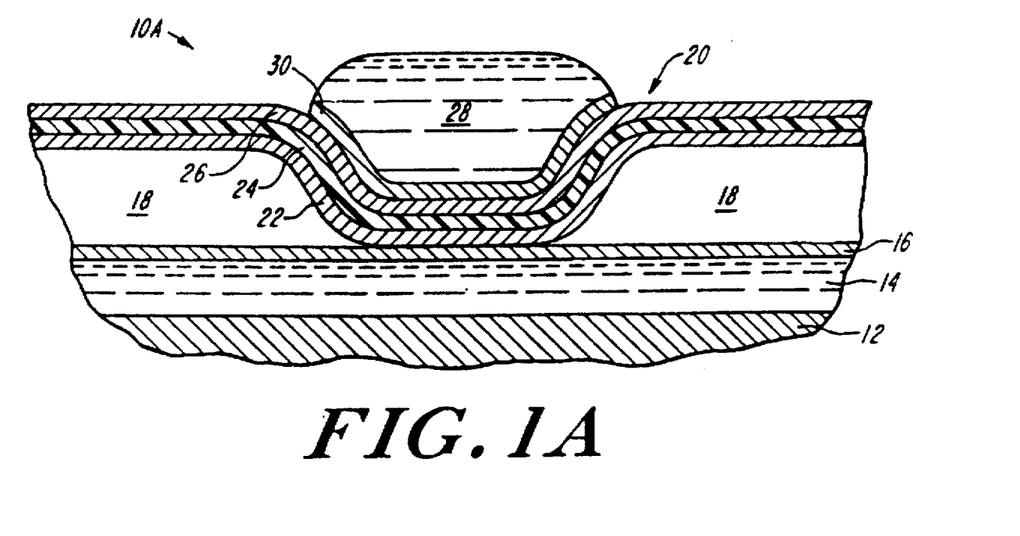
FIG. 1A is a sectional schematic view of a voltage programmable link structure according to the invention.

In FIG. 1A, a programmable link structure 10A is shown formed upon a substrate 12 (which can be a field insulator or an active device layer of an integrated circuit wafer). The link 10A includes a first (lower) metallization layer 14 comprising a refractory conductive material. In one embodiment, first metallization layer 14 consists entirely of a refractory conductive material. In another embodiment it comprises a first layer of non-refractory conductive material, such as aluminum or silicon, and a second, capping, layer of refractory conductive material.

Alternatively, in the embodiment of FIG. 1A, first metallization layer 14 can be modified aluminum. In its simplest form, modified aluminum can be formed by depositing an aluminum layer on substrate 12, followed by deposition of a thin (e.g., less than about 50 nm) refractory conductive layer. The wafer can then be sintered to form an intermetallic compound. The bimetal film may be patterned either before or after this sintering step, and the insulators 18 and 20 may be deposited either before or after the sintering step. (A method of forming a modified aluminum metallization layer 14 is illustrated in FIG. 2 and described in more detail below.)

First metallization layer 14 may further include a thin conductive top coating 16 (again less than about 50 nanometers) of a non-refractory conductor, such as aluminum.

Above this first metallization layer 14, a thick oxide insulator 18 is typically deposited in all regions, except those where a programmable link is desired. (In practice, the oxide is typically deposited uniformly over the wafer and etched away by conventional masking techniques to form a local via and expose the first metallization layer 14 or the conductive top coating 16, if present.)

In the link region, a transformable insulator 20 is then deposited as the link material into the etched via. Following deposition of the link material 20, a second (upper) metal line 28 is formed over the link (e.g., by deposition, masking and etching, or other techniques well known in the industry). Different embodiments of second metal 28 may correspond to mirror images of the possible embodiments of first metallization layer 14. So second metal 28 may consist entirely of a refractory conductive material, or alternatively, it may consist of a layer of refractory conductive material covered by a layer of non-refractory conductive material. In yet another embodiment, second metal 28 may comprise modified aluminum. A thin bottom coating of non-refractory conductive material 30 may also separate second metal 28 from link material 20.

In the illustrated embodiment, the decomposable insulator 20 comprises a three-part deposited sandwich consisting of a first silicon nitride layer 22, a middle silicon oxide layer 24 and upper silicon nitride layer 26. These three layers can each have thicknesses ranging from about 5 to 30 nanometers, preferably less than 15 nanometers. For example, each of the three layers can be about 10 nanometers thick. The thickness of these layers may vary with particular applications, but they should be designed such that the application of a voltage from upper conductive metal layer 28 to the lower metallization layer 14 will cause the link material to become conductive.

Figure 1B:
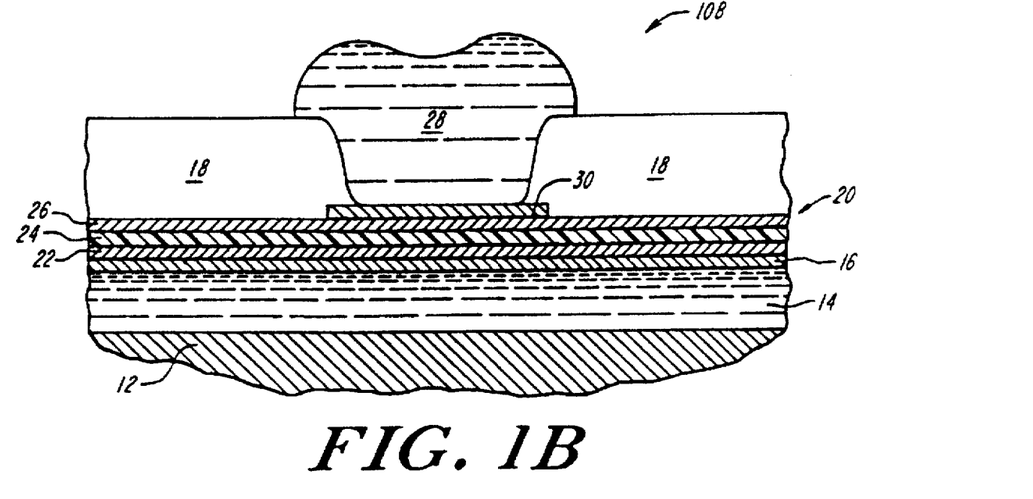
FIG. 1B is a sectional schematic view of another voltage programmable link structure according to the invention.

In FIG. 1B, an alternative embodiment of the programmable link structure 10B is shown again formed upon a substrate 12. The link 10B includes a first (lower) metallization layer 14 comprising a refractory material and, optionally, having a thin conductive top coating 16 of aluminum or the like. Deposited directly above the first metallization is the transformable insulator 20, again preferably comprising a multi-layer composite (e.g., a first silicon nitride layer 22, a middle silicon oxide layer 24 and an upper silicon nitride layer 26). Following the deposition of the link material, a thin conductive metal layer (e.g., aluminum) is deposited and patterned to form a base pad 30 for an upper conductor. A bulk insulator 18 is then deposited over the entire surface and etched away in the region of the link. This etched via is then filled with a conductive material 28 (e.g., aluminum, modified aluminum or a bulk refractive conductor) which forms the rest of upper conductor.

Figure 2A:
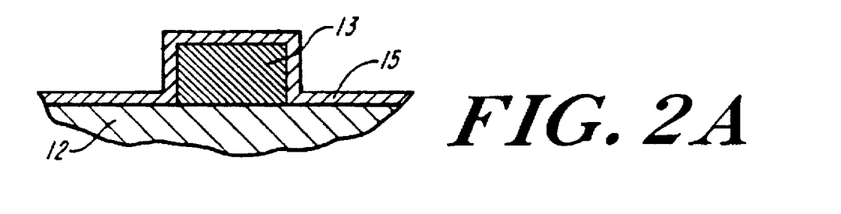
Figure 2B:
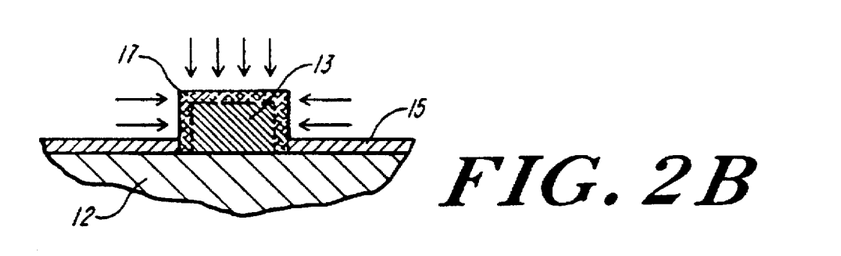
Figure 2C:
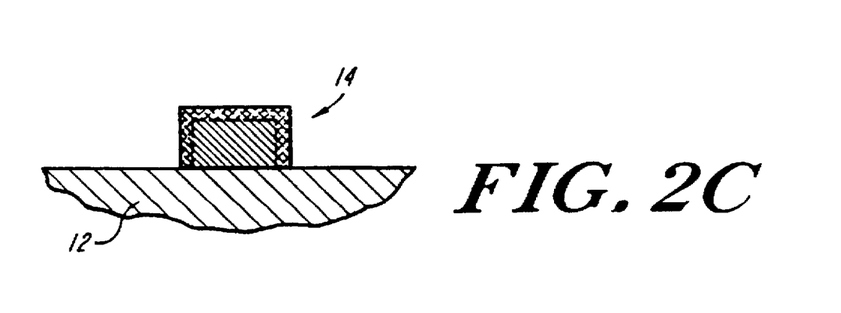
FIG. 2C is a further processing step, respectively, in the formation of a metallization according to the invention.

FIGS. 2A–2C illustrate a process for fabricating aluminum which is modified on its sidewalls as well as its top surface. First, as shown in FIG. 2A, an aluminum line 13 is deposited on substrate 12. Then a thin layer of refractory conductive material 15 is deposited over aluminum 13. The refractory material 15 may be deposited exclusively over the aluminum 13, or alternatively, the refractory material 15 may also be deposited over other portions of the substrate 12. The wafer is then sintered which causes an intermetallic compound 17 to form near the adjacent surfaces of the aluminum 13 and the refractory conductive material 15.

FIG. 2B illustrates the formation of the intermetallic compound. The combination of the aluminum 13 and the intermetallic compound 17 comprises the modified aluminum.

Finally, as shown in FIG. 2C, a selective "etch back" procedure removes the unreacted refractory material 15, re-exposing the substrate in regions where no aluminum was present, but the surface of the modified aluminum remains as an intermetallic compound with refractory properties.

In some instances, (particularly when additional active device layers or metallization layers are desired above the second metallization layer, it may be preferable to repeat the aluminum-modifying step at the top surface of the second metallization layer, thereby, achieving a hillock-free upper surface of the second metal layer. (This upper surface can further be coated with a protective or smoothing coating, e.g., on the order of about 10 to 50 nanometers, of aluminum.)

An alternative method of incorporating the refractory component into the metallization would be to employ ion implantation techniques to drive titanium, molybdenum or other refractory metal ions into the aluminum layer (e.g., either uniformly across the surface immediately following the aluminum deposition step, or selectively at link sites following patterning of the metallization lines) to create at least one modified aluminum conductor at the link site.

Figure 3:
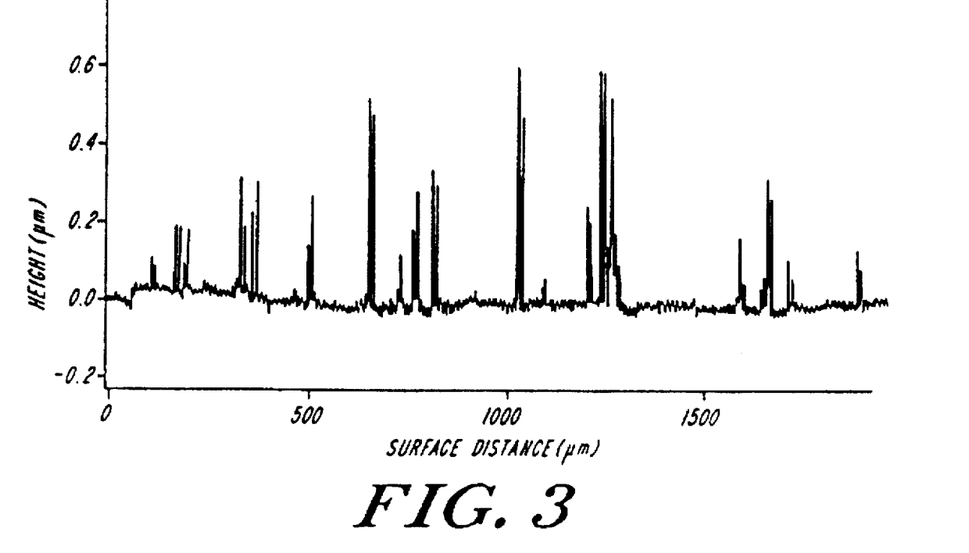
FIG. 3 is a graph of the surface profile of a conventional aluminum metallization layer, following common sintering treatment, showing the formation of irregular surface hillocks.

FIG. 3 is a graph illustrating the typical surface irregularities found when aluminum is deposited as a first (lower) metallization layer material. As can be seen in FIG. 3, the aluminum surface exhibits a number of protrusions or "hillocks" which extend above the surface layer by as much as 1 micrometer. The surface irregularities can result in microfractures of the overlying materials during wafer processing.

Figure 4:
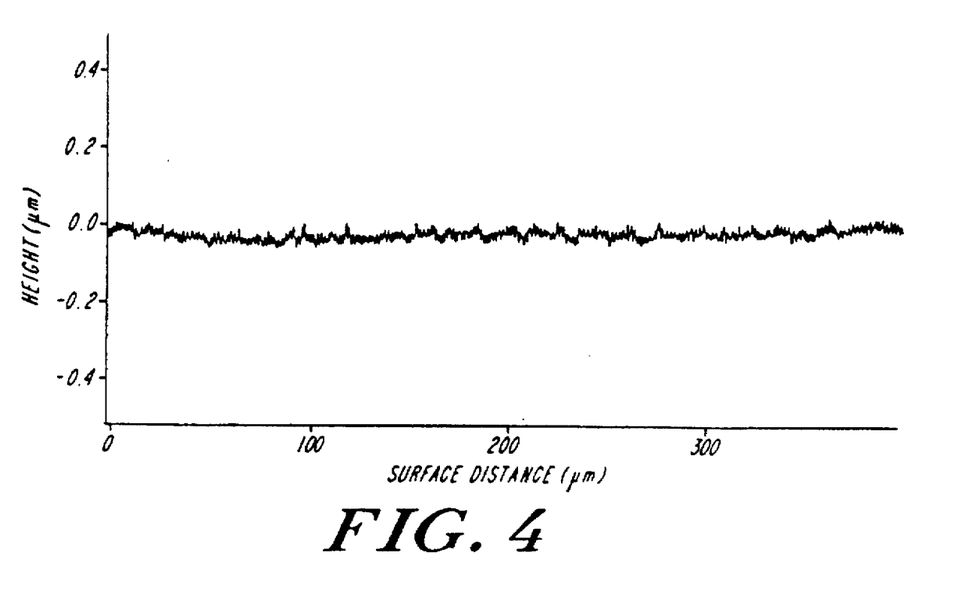
FIG. 4 is a graph of the surface profile of a modified metallization layer according to the invention, again following sintering, showing the formation of a smooth surface without hillocks.

In contrast, FIG. 4 shows the much smoother surface structure of modified aluminum treated in accordance with the present invention.

Figure 5:
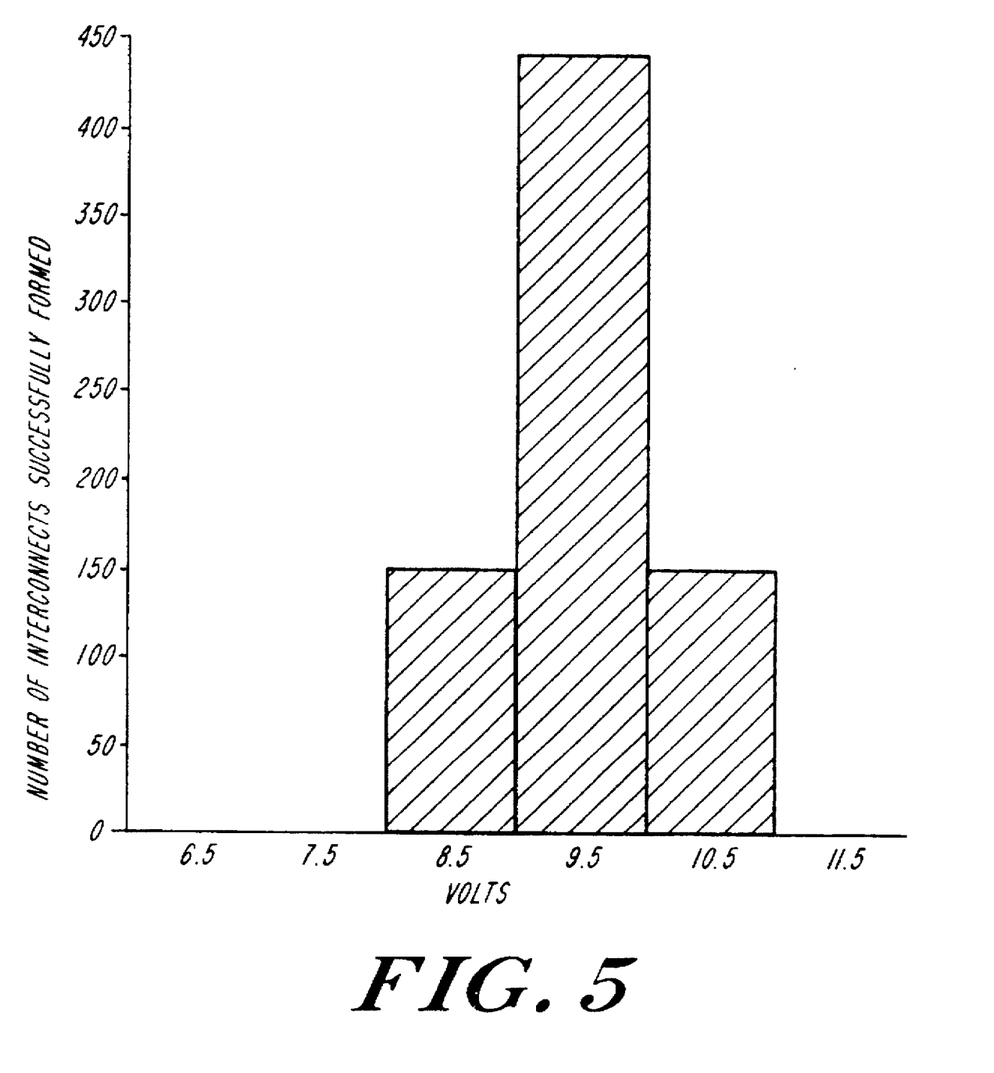
FIGS. 5 and 6 are histograms of programmable links activated by an applied voltage in accordance with the invention, showing the relative numbers of links achieved at various programming voltages.

FIG. 5 is an histogram of programmable links activated by an applied voltage in accordance with the invention, showing the relative numbers of links achieved at various programming voltages. As the results indicate, the distribution of breakdown voltages was quite narrow. A total of 742 links were activated by application of voltage in the range of about 8.5 to 10.5 volts. The link structures were nitride-oxide-nitride (10 nanometers each) sandwich structures with molybdenum as the lower conductor and aluminum as the upper conductor.

Figure 6:
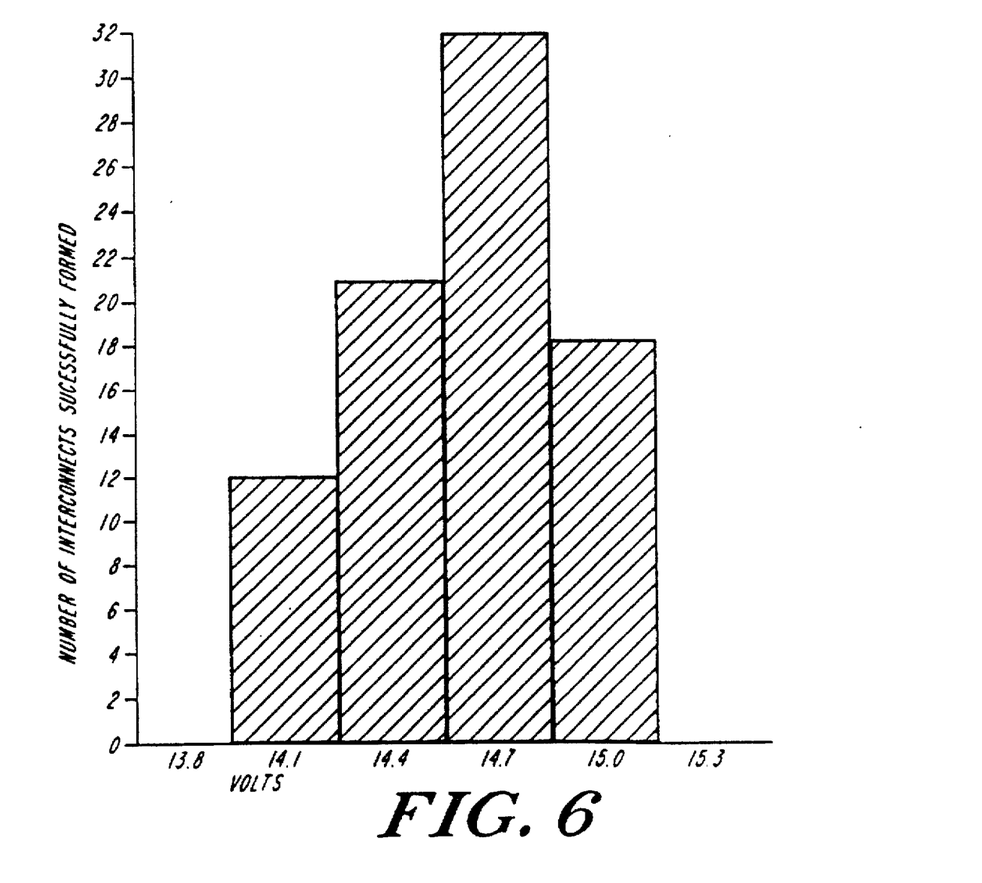

FIG. 6 is an histogram of programmable link structures made with modified aluminum and activated by an applied voltage in accordance with the invention, showing the relative numbers of links achieved at various programming voltages. The distribution of breakdown voltages was again quite narrow. A total of 85 links were tested. Two broke down at 13.5 and 13.7 volts. The remaining 83 were activated by application of voltage in the range of about 14.0 to 15.2 volts. (Similar tightly bounded behavior can be achieved at lower breakdown voltages by simply decreasing the thickness of the link dielectric materials or by heat-cycling the transformable insulator, as described in more detail below.)

The links included in FIG. 6 were fabricated on a single wafer. The thickness of the aluminum alloy (AlSi) used in the lower conductor was 750 nm. The aluminum was coated with a 30 nm layer of titanium, and then 30 nm of Al. A thick silicon oxide insulator was formed over the first layer of metallization everywhere except the link regions, where the transformable insulators were deposited. These link insulators were nitride-oxide-nitride (10, 15, 10 nanometers each) sandwich structures. The upper conductors were fabricated above the transformable insulators with a 30 nm layer of Al, followed by a 750 nm layer of AlSi. Finally, the wafer was sintered at 455° C. for 30 minutes.

Similar link structures have also been fabricated with aluminum layers coated with molybdenum and then sintered to yield molybdenum-modified aluminum metallizations.

Another advantage of the link structures of the present invention is that the breakdown voltage can be adjusted by a simple step of heat cycling, thereby permitting the manufacturer to tailor the programming voltage of particular devices to specific needs. Without being limited to any particular principle or mechanism, it appears that sintering permits the reaction of the refractory component of the metallization (e.g., the titanium) with elements that form the link material, thereby forming conductive (or semiconductive) titanium nitrides and oxides, or the like, which weaken the link and result in lower breakdown voltages. For example, the breakdown voltage can be adjusted by sintering the device at about 450° C. for one or more thirty-minute cycles.

This feature is particularly useful in overcoming the problem of achieving low breakdown voltages with existing device structures. Normally, low breakdown voltages can only be achieved by using extremely thin link materials, which are prone to inadvertent failure. In contrast, the breakdown voltage of links according to the present invention can be "customized" simply and without resort to extremely thin structures.

Figure 7:
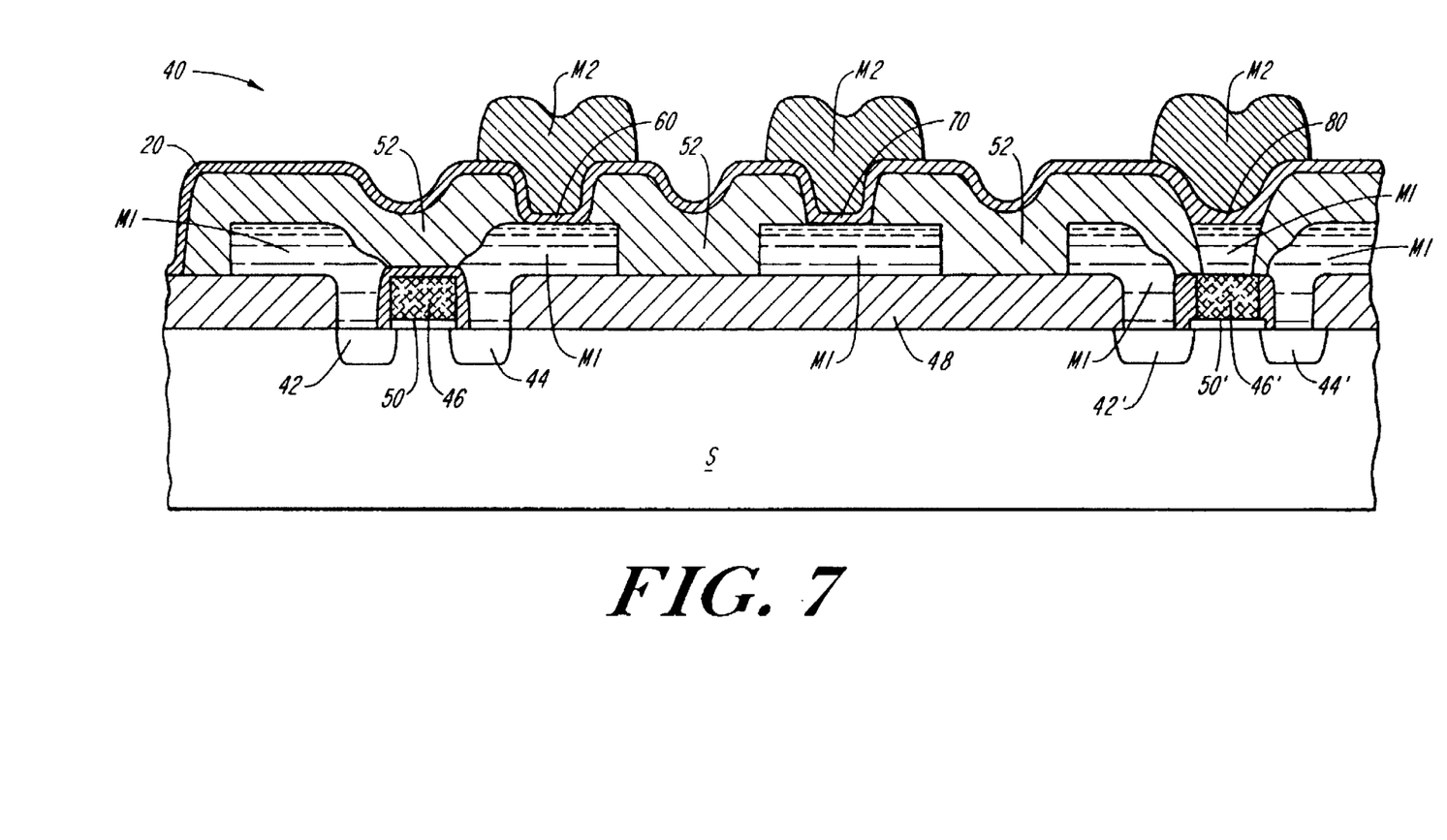
FIG. 7 is a sectional view of an integrated circuit showing a plurality of programmable link structures in accordance with the invention.

FIG. 7 is a sectional view of an integrated circuit 40 showing a plurality of programmable link structures in accordance with the invention. In circuit 40 a number of active devices are formed upon a substrate S. For example, on the left side of the illustration, a transistor is shown comprising source 42, drain 44 and gate 46. The components of this active device are isolated from the other structures of the wafer by a thick oxide layer 48 (and a thinner gate oxide 50 in the vicinity of the transistor gate 46). The formation of such active devices is well known in the art. Another transistor having similar source, drain and gate elements 42', 44', and 46', respectively, is shown at the right side of FIG. 7.

First metallization layer M1 is deposited in order to interconnect various active device elements on circuit 40. For example, on the left side of the illustration, the conductor layer M1 provides electrical connections to the source 42 and drain 44. Metallization layer M1 can also provide electrical contacts with polysilicon gate region 46' as shown on the right side of the figure. In accordance with the present invention, metallization layer M1 comprises a refractory conductive material, composite, or modified aluminum, as described above, which substantially reduces the hillock-induced defects associated with aluminum-based structures. Layer M1 can further include a non-refractory top coating as described above. After the horizontal interconnect layer M1 is formed, the metal lines are then isolated by insulator layer 52 which covers the lines except in those regions where programmable links are desired.

In each of the link regions 60, 70 and 80, as shown on FIG. 7, a via is first created (e.g., by etching away portions of insulator 52) above those sites where a link is to be formed with the underlying metal lines M1. Within these vias (and over other regions of insulator 52), a decomposable insulator 20 is deposited according to the present invention. The decomposable insulator 20 can comprise a three-part deposition sandwich, as described above, consisting of a first silicon nitride layer 22, a middle silicon oxide layer 24 and upper silicon nitride layer 26.

These three layers can each have thicknesses ranging from about 3 to 30 nanometers, preferably less than 15 nanometers. For example, each of the three layers of the link structure 20 can be about 10 nanometers thick. Following the deposition of the link material, a second (upper) metallization layer M2 can be deposited and patterned to form another set of interconnects, again as described above.

Link structure 60, as shown in FIG. 7, permits an electrically programmable link to be formed between upper metal layer M2, lower layer M1 and transistor drain 44. Similarly, link structure 70 permits the formation of a link between layers M2 and M1 (in which the M1 line is electrically connected to another device element not shown in the sectional plane of FIG. 7). Link structure 80 permits the formation of a link between M2, M1 and the gate 46' of the transistor shown on the right side of the figure. Various other arrangements of interconnects, devices and links can be appreciated by those skilled in the art.

What is claimed is:

1. A method of producing an antifuse link in an integrated circuit structure, the method comprising:

depositing a lower conductive element;

depositing a transformable insulator material over the lower conductive element, the transformable insulator being transformable by a programming voltage of less than 15 volts to form a direct conductive path therethrough;

depositing an upper conductive layer over the insulator material and patterning said upper conductive layer to leave conductive regions over regions of transformable insulator material, the transformable insulator material being substantially wider than regions where interlayer link openings are to be formed;

depositing a thicker insulator layer over the upper conductive layer and etching the insulator away to form said interlayer link openings, whereby the upper conductive layer serves as an etch stop to preserve the transformable insulator beneath the conductive regions of the upper conductive layer; and depositing an additional conductive material in said interlayer link openings to provide an upper conductive element.

2. The method of claim 1 wherein the step of depositing a lower conductive element comprises depositing a non-refractory conductive material followed by depositing a refractory conductive material over said non-refractory conductive material.

3. The method of claim 2 wherein the method further comprises the step of sintering following the deposition of said non-refractory and refractory conductive materials.

4. The method of claim 2 further comprising the step of forming an intermetallic compound near a boundary of said non-refractory conductive material.

5. The method of claim 4 wherein the step of forming an intermetallic compound is followed by removing a portion of said refractory conductive material.

6. The method of claim 2 wherein the step of depositing a refractory conducive material further comprises depositing a refractory conductive material having a thickness of not more than about 50 nanometers.

7. The method of claim 2 wherein said non-refractory material comprises aluminum.

8. The method of claim 1 wherein the step of depositing a lower conductive element further comprises depositing a material chosen from the group consisting of refractory metals, refractory metal alloys, refractory metal silicides, and refractory metal nitrides.

9. The method of claim 1 wherein the refractory material comprises a refractory material selected from the group of titanium, molybdenum, and tungsten.

10. The method of claim 9 wherein the refractory material comprises titanium.

11. The method of claim 9 wherein the refractory material comprises molybdenum.

12. The method of claim 1 wherein the step of depositing a refractory material further comprises depositing a refractory material having a thermal coefficient of expansion less than about $10.0 \times 10^{-6}/°C$.

13. The method of claim 1 wherein the method further comprises coating the lower conductive element with a thin layer of a non-refractory conductive material.

14. The method of claim 13 wherein the non-refractory conductive layer is aluminum.

15. The method of claim 13 wherein the non-refractory conductive layer is silicon.

16. The method of claim 1 wherein the step of fabricating a lower conductive element comprises depositing a non-refractory conductive material followed by implanting ions of a refractory material into said non-refractory material.

17. The method of claim 1 wherein the step of depositing a transformable insulator material further comprises depositing a multi-layer structure comprising at least one silicon oxide layer, and at least one silicon nitride layer.

18. The method of claim 17 wherein the thickness of the oxide layer ranges from about 3 to about 30 nanometers.

19. The method of claim 17 wherein the thickness of each layer ranges from about 3 to about 30 nanometers.

20. The method of claim 17 wherein the silicon nitride layer is silicon-rich.

21. The method of claim 20 wherein the nitride is a composition according to the formula $SiN_y$ where y ranges from about 0.3 to about 1.3.

22. The method of claim 17 wherein the silicon oxide layer is silicon-rich.

23. The method of claim 22 wherein the oxide is a composition according to the formula $SiO_x$ where x ranges from about 1.5 to about 2.0.

24. The method of claim 1 wherein the method further comprises after the depositing steps the step of heat-treating the integrated circuit structure to establish a breakdown voltage for said transformable insulator.

25. The method of claim 24 wherein the step of heat-treating comprises sintering the integrated circuit structure to alter the insulator and thereby lower the voltage necessary to create the conductive path.

26. The method of claim 1 wherein the step of depositing an upper conductive element further comprises depositing an aluminum material.

27. The method of claim 1 wherein the step of depositing an upper conductive element further comprises depositing a refractory material.

28. The method of claim 1 wherein the upper conductive layer is a thin metal layer, and the method further comprises the step of sintering to fuse the thin metal layer initially deposited with the additional conductive material deposited above said thin metal layer.

29. A method of producing an interlayer conductive path in an integrated circuit structure, the method comprising:

depositing a lower conductive element;

depositing a transformable insulator material over the lower conductive element, the transformable insulator being transformable by a programming voltage to form a direct conductive path therethrough;

depositing an upper conductive layer above the transformable insulator material and patterning the upper conductive layer to define regions over regions of transformable insulator material, the transformable insulator material being substantially wider than regions where interlayer link openings are to be formed;

depositing an insulator layer over the upper conductive layer and etching the insulator away to form said interlayer link openings, the upper conductive layer serving as an etch stop to preserve the transformable insulator beneath the upper conductive layer;

depositing an additional conductive material in the etched region to provide an upper conductive element; and applying a voltage between the upper and lower conductive elements across the transformable insulator material such that at least one conductive path is formed between the upper and lower conductive elements.

30. A method as claimed in claim 29 wherein the upper conductive layer is patterned by removing the upper conductive layer except in regions where an interlayer link is desired.

31. A method as claimed in claim 29 wherein the upper conductive layer is aluminium.

* * * * *

UNITED STATES PATENT AND TRADEMARK OFFICE
CERTIFICATE OF CORRECTION

PATENT NO. : 5,641,703
DATED : June 24, 1997
INVENTOR(S) : Simon S. Cohen, Jack I. Raffel & Peter W. Wyatt It is certified that error appears in the above-indentified patent and that said Letters Patent is hereby corrected as shown below:

In Column 11, at lines 47, 54 and 58, change "claim 1" to
---claim 2---.

In Column 12, at lines 27 and 30, change "element" to
---layer---.

Signed and Sealed this

Twenty-third Day of September, 1997

Attest:

BRUCE LEHMAN

Attesting Officer     Commissioner of Patents and Trademarks